United States Patent
Yoon et al.

(10) Patent No.: US 11,525,878 B1
(45) Date of Patent: Dec. 13, 2022

(54) SUPERCONDUCTOR MAGNETIC FIELD EFFECT TRANSISTOR WITH SOLENOID

(71) Applicant: HRL Laboratories, LLC, Malibu, CA (US)

(72) Inventors: Yeong Yoon, Oak Park, CA (US); Jongchan Kang, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 10 days.

(21) Appl. No.: 16/950,724

(22) Filed: Nov. 17, 2020

Related U.S. Application Data

(60) Provisional application No. 62/941,587, filed on Nov. 27, 2019.

(51) Int. Cl.
| | | |
|---|---|---|
| *H01L 27/18* | (2006.01) | |
| *G01R 33/3815* | (2006.01) | |
| *H01L 39/24* | (2006.01) | |
| *H01F 6/00* | (2006.01) | |

(52) U.S. Cl.
CPC ........... *G01R 33/3815* (2013.01); *H01F 6/00* (2013.01); *H01L 27/18* (2013.01); *H01L 39/248* (2013.01)

(58) Field of Classification Search
CPC ........................ H01F 6/00; H01L 27/18; H01L 39/00–39/2496
See application file for complete search history.

(56) References Cited

U.S. PATENT DOCUMENTS

| | | | |
|---|---|---|---|
| 5,015,622 A | * | 5/1991 | Ward ..................... H02K 55/00 505/852 |
| 5,338,943 A | | 8/1994 | Wilber et al. |
| 11,237,234 B2 | * | 2/2022 | Parkinson ............ G01R 33/381 |

OTHER PUBLICATIONS

Wördenweber, R. et al., "Superconductors at the Nanoscale", European Cooperation in Science and Technology, 2017, 508 pages, Walter de Gruyter GmbH.
Glowacka, D.M. et al., "Development of a NbN Deposition Process for Superconducting Quantum Sensors", IEEE Transactions on Terahertz Science and Technology, 2013, pp. 1-5.
Hohenwarter, G.K.G. et al., "Characteristics of Superconducting Flux-Flow Transistors", IEEE Transactions on Magnetics, pp. 3297-3300, Mar. 1991, vol. 27, No. 2, IEEE.
Ikebe, Y. et al., "Vortex dynamics in a NbN film studied by terahertz spectroscopy", Physical Review B, May 22, 2009, pp. 174525-1 through 174525-7, vol. 79, The American Physical Society.
Kim, Y.B. et al., "Flux-Flow Resistance in Type-ll Superconductors", Physical Review, Aug. 16, 1965, pages A 1163 through A 1172, vol. 139, No. 4A.

(Continued)

*Primary Examiner* — Ramon M Barrera
(74) *Attorney, Agent, or Firm* — Lewis Roca Rothgerber Christie LLP

(57) ABSTRACT

A superconductor magnetic field effect transistor. The superconductor magnetic field effect transistor may include a sheet of a superconducting material; and a solenoid. The sheet may be substantially flat, and the solenoid may include a plurality of turns, each of the turns being substantially parallel to the sheet. The superconducting material may be a type-II superconducting material.

12 Claims, 7 Drawing Sheets

(56) References Cited

OTHER PUBLICATIONS

Martens, J.S., "The models and applications of a high-frequency three terminal device made of high-temperature superconductors", Dissertation submitted to the Graduate School of the University of Wisconsin-Madison in partial fulfillment of the requirements for the degree of Doctor of Philosophy in Electrical Engineering, 1990, 408 pages, University Microfilms International Dissertation Information Service.

Nevirkovets, I.P. et al., "Critical Current Gain in High-$j_c$ Superconducting-Ferromagnetic Transistors", IEEE Transactions on Applied Superconductivity, Dec. 2016, 7 pages, vol. 26, No. 8, IEEE.

Silva, E. et al., "Vortices at microwave frequencies", 2017, pp. 253-277, De Gruyter.

Tazch, Y., "Evaluation of High-Frequency Performances of a Superconducting Base Transistor Using High-Tc Materials", IEEE Transactions on Magnetics, Mar. 1991, pp. 3316-3319, vol. 27, No. 2, IEEE.

\* cited by examiner

SUPERCONDUCTOR MAGNETIC FIELD EFFECT TRANSISTOR WITH SOLENOID

CROSS-REFERENCE TO RELATED APPLICATION(S)

The present application claims priority to and the benefit of U.S. Provisional Application No. 62/941,587, filed Nov. 27, 2019, entitled "SUPERCONDUCTOR MAGNETIC FIELD EFFECT TRANSISTORS (SMFETS)", the entire content of which is incorporated herein by reference.

FIELD

One or more aspects of embodiments according to the present disclosure relate to electronic devices, and more particularly to a superconductor magnetic field effect transistor.

BACKGROUND

Cryogenic electronic devices have various advantages over room-temperature semiconductor devices. However, cryogenic semiconductor transistors may suffer from hot electron injection into the thin gate insulation, which may result in many long lived and low energy traps, which, in turn, may increase flicker noise. Modified or hybrid Josephson junction devices may suffer from poor isolation between input and output due to high shunt conductance. Latching two-Josephson-junction devices and non-latching superconducting quantum interference devices (SQUIDs) may suffer from poorly defined gain in spite of their being switchable. Thus, there is a need for an improved cryogenic electronic device.

SUMMARY

According to an embodiment of the present invention, there is provided a device, including: a sheet of a superconducting material; and a solenoid, the sheet being substantially flat, the solenoid including a plurality of turns, each of the turns being substantially parallel to the sheet, the superconducting material being a type-II superconducting material.

In some embodiments, the sheet is substantially rectangular.

In some embodiments, the sheet has two long edges and two short edges, each of the short edges being at least 10% shorter than each of the long edges.

In some embodiments, a respective current-carrying electrode is connected to each of the short edges.

In some embodiments, each turn of the solenoid can be rectangular, octagonal, or circular and has substantially the same dimensions as the sheet.

In some embodiments, the solenoid includes more than 1 turns on a first side of the sheet.

In some embodiments, the solenoid further includes the same number of turns on a second side of the sheet, the second side of the sheet being opposite the first side of the sheet.

In some embodiments, the solenoid is configured to produce a magnetic field having a magnetic field strength uniform to within 10% within the sheet.

In some embodiments, the device further includes a ferromagnetic element, the ferromagnetic element being configured to increase the magnetic field strength at a point in the sheet.

In some embodiments, the ferromagnetic element includes an E-core.

In some embodiments, the device exhibits a current gain of at least 5, at a voltage drop across the sheet of 2 V and a solenoid current of 100 microamperes, the current gain being the ratio of current flowing through the sheet to current flowing in the solenoid.

In some embodiments, the solenoid includes a superconductor having a critical temperature greater than that of the sheet.

In some embodiments, the solenoid includes a superconductor having a first critical magnetic field strength greater than that of the sheet.

In some embodiments, the solenoid includes a superconductor having a second critical magnetic field strength greater than that of the sheet.

According to an embodiment of the present invention, there is provided a method for fabricating a device, the method including: forming a first turn of a solenoid on a substrate forming a sheet of a superconducting material on the substrate; and forming a second turn of the solenoid on the substrate.

In some embodiments, the method further includes: forming a first current-carrying electrode, connected to a first portion of a boundary of the sheet; and forming a second current-carrying electrode, connected to a second portion of a boundary of the sheet.

In some embodiments, the forming of the first turn of the solenoid includes: forming a layer of photoresist on the substrate; patterning the photoresist, to remove a portion of the photoresist, exposing a portion of the substrate; depositing a layer of superconductor on the photoresist, and directly on the exposed portion of the substrate; and lifting off the layer of superconductor except where it is directly on the substrate.

According to an embodiment of the present invention, there is provided a method of operating a device, the device including: a sheet of a superconducting material; a first current-carrying electrode, connected to a first portion of a boundary of the sheet; a second current-carrying electrode, connected to a first portion of a boundary of the sheet; and a solenoid, the method including: causing a current to flow through the solenoid, the current flow producing a magnetic field in the sheet, the magnetic field being uniform to 10% within the sheet.

In some embodiments, the magnetic field is uniform to within 5% within the sheet.

In some embodiments, the method further includes causing a current to flow from the first current-carrying electrode to the second current-carrying electrode, through the sheet.

BRIEF DESCRIPTION OF THE DRAWINGS

These and other features and advantages of the present disclosure will be appreciated and understood with reference to the specification, claims, and appended drawings wherein:

DETAILED DESCRIPTION

Figure 1A:
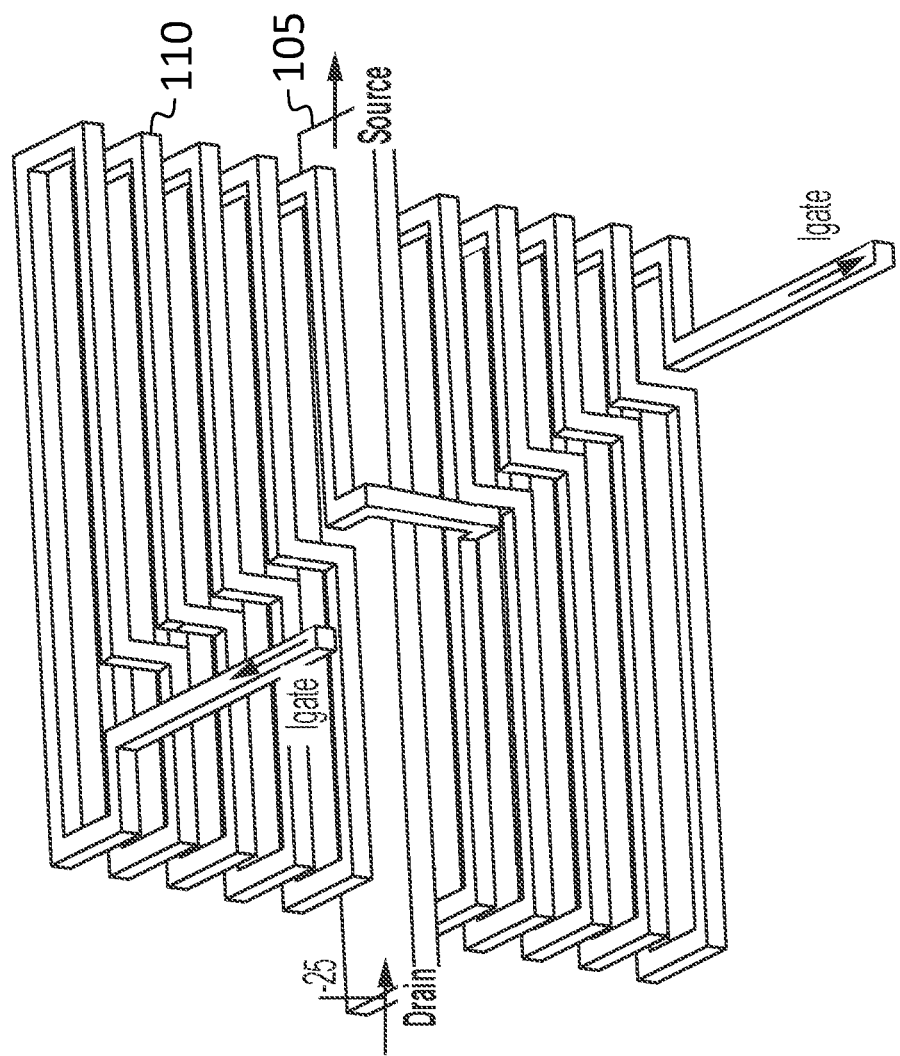
FIG. 1A is a perspective view of a superconductor magnetic field effect transistor, according to an embodiment of the present disclosure.

The detailed description set forth below in connection with the appended drawings is intended as a description of exemplary embodiments of a superconductor magnetic field effect transistor provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Referring to FIG. 1, in some embodiments a superconductor magnetic field effect transistor (SMFETs) includes a superconducting sheet 105 and a solenoid 110 for subjecting the superconducting sheet 105 to a magnetic field. The solenoid may be formed of a plurality of substantially planar turns of wire, the wire of each turn having a thickness (in the direction perpendicular to the plane of the turn) and a width (in the direction perpendicular to the wire and in the plane of the turn). Each turn (excluding the vias (described in further detail below) connecting adjacent turns) may be "substantially planar" in the sense that the wire of each turn may be entirely between two planes separated by a distance between 1.1 times and 5.0 times the thickness (e.g., the average thickness) of the wire. The superconducting sheet 105 may be "substantially planar" in the sense that all of the superconducting sheet 105 may be entirely between two planes separated by a distance between 1.1 times and 5.0 times the thickness (e.g., the average thickness) of the superconducting sheet 105.

As used herein, a "superconducting sheet" is a sheet composed of a material that behaves as a superconductor under suitable conditions, e.g., at sufficiently low temperature called the critical temperature, $T_c$, current density, and magnetic field. As such, the superconducting sheet 105 of the superconductor magnetic field effect transistor of FIG. 1 may be referred to as a "superconducting sheet" regardless of whether the transistor is at sufficiently low temperature for the sheet to be superconducting. Similarly, a "superconducting wire" is a wire composed of a material that behaves as a superconductor under suitable conditions, e.g., at sufficiently low temperature, current density, and magnetic field, and the wire of the solenoid 110 may be referred to as a "superconducting wire" if it composed of such a material, regardless of whether the transistor is at sufficiently low temperature for the wire of the solenoid 110 to be superconducting.

The superconducting sheet 105 may be composed of a type-II superconductor . . . type-II superconductors may exhibit a phase (which may be referred to as a "vortex state") below the critical temperature, where vortices may form in the presence of a magnetic field. The vortices are absent when the type-II superconductor is in a magnetic field having a magnetic flux density less than a first critical magnetic flux density $B_{c1}$, and the density and size of the vortices increases with increasing magnetic flux density, until, at a second critical magnetic flux density $B_{c2}$, the material no longer exhibits superconductivity (and behaves as a normal conductor). The superconducting sheet 105 may be composed of any suitable type-II superconductor, such as a suitable nickel alloy, or niobium-alloy or high temperature superconductor materials.

Type II superconducting materials have the unique phase called a "vortex state", or mixed state depending on orthogonal magnetic fields. Quantized magnetic flux, B penetrates superconductor films through vortices. Inside the vortices the material is in a normal conducting state. The vortices move to the orthogonal direction due to Lorentz force if there are transport currents, J in a channel between drain and source. The vortices moving with average velocity, u̇ experience a viscous force. The motion of vortices containing B gives rise to an electric field E=B×u̇. The electric field has a component in the direction opposite to that of the transport current, such that J·E≠0, and causes the transport current to generate heat as if the material had an Ohmic resistance. The flux-flow resistivity due to moving vortices is a function of orthogonal magnetic fields in the mixed state when the magnetic flux density is between the first critical magnetic flux density and the second critical magnetic flux density.

in a mixed state, the movement of a single vortex may be phenomenologically described by the equation of motion, mü=$f_{th}$−ηu̇−$k_p$u, where m and u are the mass and displacement, respectively, of a vortex, and, $f_L$ and $f_{th}$ are the Lorentz and thermal force respectively, and η and $k_p$ are the coefficients respectively for viscosity and for pinning effects. At the onset of moving, the equation may be simplified to ηu̇+$k_p$u=J×Φ$_0$+$f_{th}$, where Φ$_0$ is a flux quantum and J is a transport current density. The moving flux quantum results in the generation of an electric field that is orthogonal to both the magnetic fields $\vec{B}$ and the velocity u̇ of the vortex and which opposes the transport current in the sheet, resulting in the flux-flow resistivity mentioned above (which may also be referred to as "vortex motion complex resistivity").

The flux-flow resistivity due to the viscous motion of the vortices may be described by $$\rho_{ff} = \frac{\Phi_o B}{\eta},$$

which can be approximated as $$\frac{\rho_{ff}}{\rho_n} \simeq \frac{B(T)}{B_{C2}(0)},$$

where $\rho_n$ is the resistivity of the superconducting material in the normal state, $B_{c2}(0)$ is the second critical magnetic flux at 0 K and B(T) is for the magnetic flux at T K below the critical temperature. In some embodiments, $$\frac{\rho_{ff}}{\rho_n}$$

is linearly proportional to the magnetic flux density at low values of the magnetic flux density, and it deviates from this linear relationship at higher magnetic flux density, deviating by a greater amount at higher temperatures (i.e., as $t=T/T_c$ increases). The flux flow resistance $R_{ff}$ may be calculated from $p_{ff}$ and from the channel dimensions.

In some embodiments, the channel resistance $R_{ff}$ is controlled by controlling the magnetic field applied by the solenoid 110, in such a manner that the magnetic flux density remains greater than the first critical magnetic flux density, $B_{c1}$, and less than the second critical magnetic flux density $B_{c2}$, i.e., in such a manner that the superconducting sheet 105 remains in the vortex state. In such a configuration, the combination of the superconducting sheet 105 and the solenoid 110 may operate as a channel current control device, and may be referred to as a "superconductor magnetic field effect transistor". The solenoid may include (e.g., consist of) one or more turns of a conductive wire below, above, or in the plane of the superconducting sheet 105. In some embodiments, the solenoid 110 is composed of a superconductor that remains fully superconducting in operation, e.g., in the presence of the magnetic field that drives the superconducting sheet 105 into the vortex state. In some embodiments, the solenoid 110 is composed of a type-II high temperature superconductor that has a critical temperature greater than that of the superconducting sheet 105. In some embodiments, the solenoid 110 is composed of a normal conductor. The material employed to form the solenoid 110 may depend on the application and on the fabrication process.

Figure 1B:
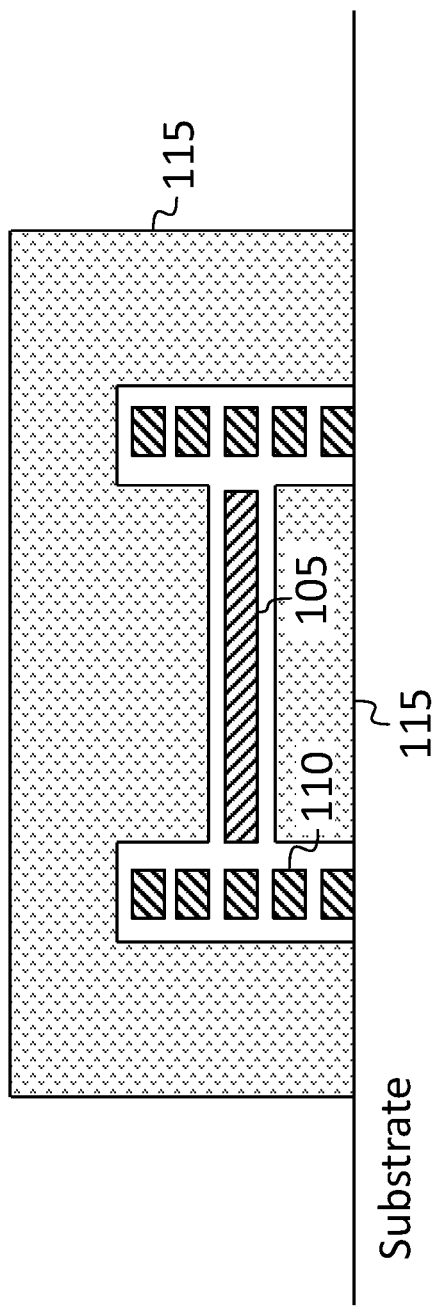
FIG. 1B is a cross-sectional view of a superconductor magnetic field effect transistor, according to an embodiment of the present disclosure.

In some embodiments, the superconductor magnetic field effect transistor further includes a ferromagnetic core, to increase the magnetic flux density in the superconducting sheet 105 (relative to the magnetic flux density that would be present in the superconducting sheet 105, at the same solenoid current, in the absence of the ferromagnetic core). In some embodiments the ferromagnetic core is an E-core 115, as shown in FIG. 1B. For ease of illustration, a solenoid 110 with ten turns is shown In FIG. 1A, and a solenoid 110 with five turns is shown in FIG. 1B. In some embodiments the solenoid has only one turn, or between 1 and 100 turns, or 100 turns or more. In some embodiments, the solenoid 110 may be a single line above the insulation layers and perpendicular to the superconductor sheet 105.

In some embodiments, the superconductor magnetic field effect transistor is fabricated as follows. A first turn of the solenoid is formed on a substrate (e.g., a silicon wafer), e.g., by forming a layer of photoresist on the substrate, patterning the photoresist to expose the substrate in the shape of the wire to be formed in the first turn, depositing (e.g., by sputtering) a layer of the material of the wire over the photoresist and the exposed substrate, removing the remainder of the photoresist and lifting off the layer of the material of the wire except where it is directly on the substrate. An insulating layer (e.g., a layer of silicon nitride or silicon dioxide) may then be deposited on the first turn of the solenoid and a second turn of the solenoid may be formed on the insulating layer, and connected to the first turn (e.g., connected in series with the first turn) through a via (which may be formed by etching a hole in the insulting layer and depositing the material of the wire in the hole). This process may be repeated to form multiple turns of the solenoid.

The superconducting sheet 105 may be deposited after one or more turns of the solenoid have been formed (or before any turns of the solenoid have been formed) by patterning a layer of photoresist to have a hole in the shape of the superconducting sheet 105 to be formed, depositing (e.g., by sputtering) a layer of the material of the superconducting sheet 105 over the photoresist and (in the hole in the photoresist) over the exposed surface under the photoresist, removing the remainder of the photoresist and lifting off the layer of the material of the superconducting sheet 105 except where it is directly on the surface under the photoresist. Additional turns of the solenoid 110 may be formed after the superconducting sheet 105 is formed. For example, to form the structure illustrated in FIG. 1A, five turns of the solenoid may be formed first, then the superconducting sheet 105 may be formed, and then another five turns of the solenoid may be formed.

The superconducting sheet 105 may be rectangular as shown in FIG. 1A; one end of the superconducting sheet 105 may be referred to as the "source" and the other end as the "drain", and the superconducting sheet 105 may be referred to as the "channel". Under constant $V_{ds}$ conditions (where $V_{ds}$ is the voltage across the superconducting sheet 105), modulation of the channel resistance $R_{ff}$ results in modulation of the current by Ohm's law ($I_{ds}=V_{ds}/R_{ff}$). The current in the channel, may also generate a significant magnetic field, $B_{channel}$, and when the channel current is $I_{crit}$, the corresponding B-field becomes $B_{c2}$ i.e., $B_{channel}=B_{c2}$, causing the superconducting sheet 105 to be in the normal conducting state. The total gate magnetic fields, $B_{gate}$ on the channel will be the sum of $B_{coil}$, generated by the coil and $B_{channel}$, generated by the channel currents. In order for the transistor to exhibit current gain, ($\beta=I_{ds}/I_{gs}$, the gate magnetic fields, $B_{gate}$ may be lower than the magnetic field, generated in the channel, when the channel current is $I_{crit}$. In some embodiments, the material and dimensions of the superconducting sheet 105 are chosen such that the normal resistivity of the channel is high enough to provide stable output impedance without matching networks. In some embodiments, the superconducting sheet 105 is "substantially rectangular" in the sense that its boundary falls entirely between two similar concentric rectangles differing in size by 20% (i.e., the larger rectangle having two short edges and two long edges, each having a length 1.2 times a corresponding edge length of the smaller rectangle). In some embodiments the sheet is substantially rectangular and has two long edges and two short edges, each of the short edges being at least 10% shorter than (i.e., having a length at most equal to 0.9 times the length of) each of the long edges. Each of the short edges may have connected to it a respective current-carrying electrode 210 (FIG. 2) for making connections to other circuit elements. In some embodiments, at least one turn (e.g., each of the turns) of the solenoid 110 is substantially rectangular and has substantially the same dimensions as the superconducting sheet 105 (e.g., each dimension of the solenoid 110 is within 30% of a corresponding dimension of the superconducting sheet 105).

In one embodiment, as example, NbN is used for the superconducting sheet 105, with a flux-flow resistivity ($\rho_{ff}$) of 150~550 uΩ-cm. The channel width, length and thickness are each within 50% of (i.e., between 0.5 and 1.5 times) 0.5 um, 10 um and 0.1 um, respectively, resulting in a normal channel resistance $R_{norm}$ of 1 kΩ (or, in some embodiments, within 50% of 1 kΩ). The solenoid has 10 turns (as shown in FIG. 1A) of a wire having a 0.1 um (micron) line width and a 0.1 um line thickness (or, in some embodiments, a number of turns that is within 50% of 10, a line width that is within 50% of 0.1 um (microns), and line thickness that is within 50% of 0.1 um). The NbN superconducting channel is located at the middle of the solenoid (above five of the turns and below five of the turns), to produce a substantially uniform magnetic field distribution. $SiO_2$ dielectric ($\mu_o=1$) is used for the core material of the gate inductor.

Three-dimensional electromagnetic simulations using MAXWELL™ were performed to find magnetic field strengths resulting from the solenoid current and resulting from the channel current. The simulations show that the solenoid 110 generates a magnetic field with a magnetic flux density of approximately 2 mT when a current of 1 mA flows through it, and that the channel generates a magnetic field with a magnetic flux density of approximately 0.65 mT when a current of 1 mA flows through it.

Figure 2:
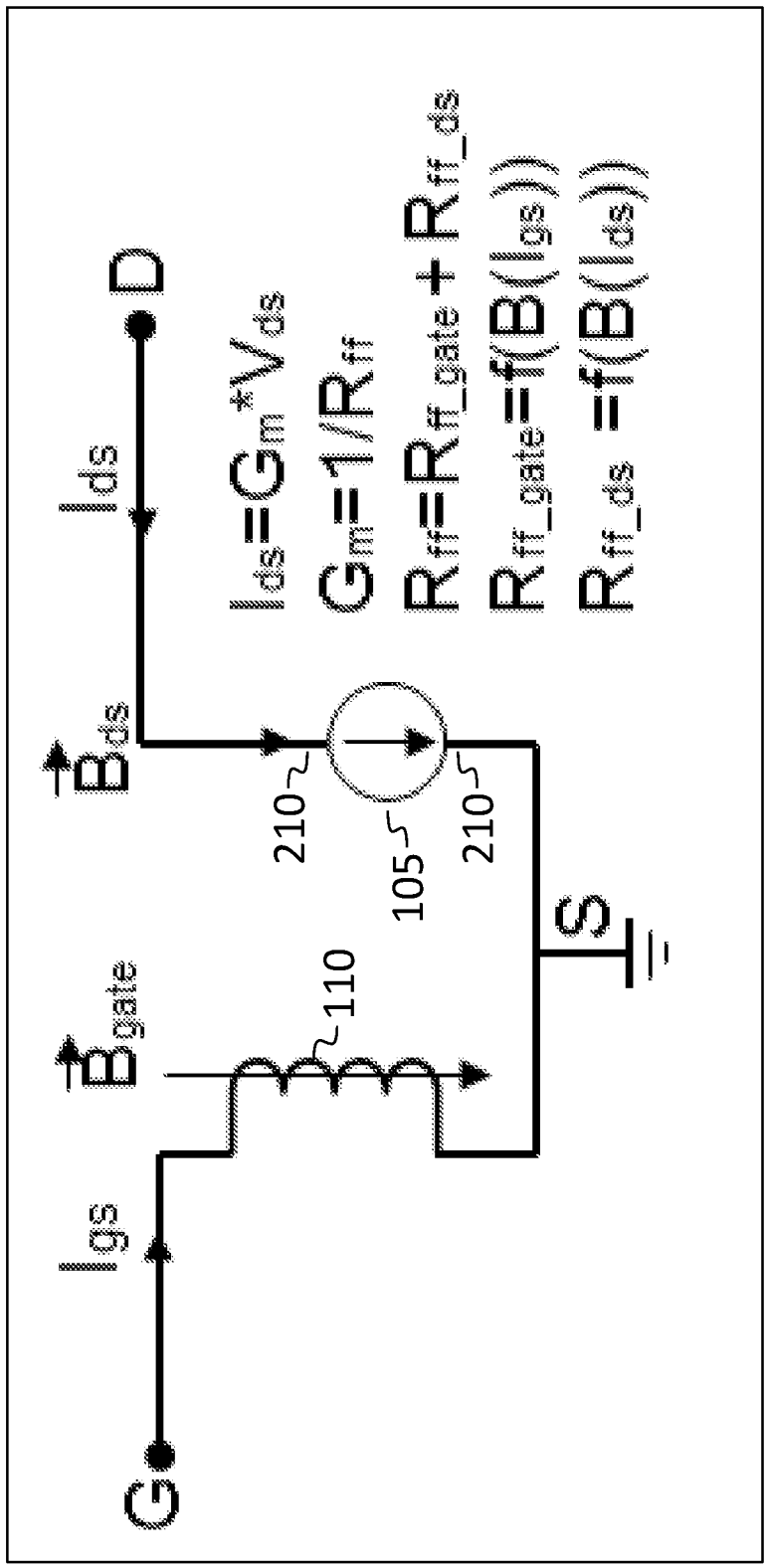
FIG. 2 is a schematic diagram of an equivalent circuit model of a superconductor magnetic field effect transistor, according to an embodiment of the present disclosure.

FIG. 2 depicts an equivalent DC model for a superconductor magnetic field effect transistor. The model includes gate (i.e., solenoid) B-fields, and may be considered to operate as a gate current controlled current source. The trans-conductance of the dependent source is defined as the inverse of the flux flow resistance, i.e., as $1/R_{ff}$. The flux flow resistance of the channel is the sum of (i) $R_{ff\_gate}$ contributed by gate B-fields due to gate current $I_{gs}$ and (ii) $R_{ff\_ds}$ contributed by the channel B-fields due to channel transport current $I_{ds}$. Temperature dependent effects were ignored for the first-order functional modeling. Values of $B_{g0}$ and $B_{ds0}$ were obtained from the three-dimensional electromagnetic simulations, with 1 mA of solenoid current and 1 mA of channel current, respectively. The channel dimensions were selected to produce a normal channel resistance of 1 kn. The critical current was 10 mA in the simulated device. As mentioned above, the flux-flow resistance, $R_{ff}$ is:

$$R_{ff}=R_{ff\_gate}+R_{ff\_ds}$$

In this equation, the first term, $R_{ff\_gate}$ may be written $$R_{ff\_gate}=B_{gate\_scale} \times B_{g0} \times I_{gs}/I_{gs0}$$

where $B_{g0}$ is the magnetic flux density, 2 mT in the channel at $I_{gs0}=1$ mA and $B_{gate\_scale}$ is a constant relating $R_{ff\_gate}$ at the gate current $I_{gs}$. According to the phenomenological relation $$\frac{\rho_{ff}}{\rho_n} \simeq \frac{B(T)}{B_{C2}(0)}$$

(mentioned above), the flux flow resistivity is proportional to the ratio of B-field $B(T)$ to $B_{c2}(0)$ at OK. A linear proportionality is assumed for simplicity. Thus, $B_{gate\_scale}$ was calculated to have a value of $10^5$ in order to have a design value, $R_{ff\_gate}=200\Omega$ at $I_{gs}=1$ mA for instance. And, $R_{ff\_gate}$ reaches to $R_{norm}$ (=1 k$\Omega$) at $I_{gs}=5$ mA. Similarly, the second term of $R_{ff\_ds}$ is defined as:

$$R_{ff\_ds}=B_{ds\_scale} \times B_{ds0} \times I_{ds}/I_{ds0}.$$

The proportional constant $B_{ds\_scale}$ is set to $1.52\times10^5$ so that $R_{ff\_ds}$ becomes equal to ~1 k$\Omega$ at $I_{ds}=10$ mA, where 10 mA is assumed as $I_{crit}$ of NbN channel with 0.5 um width. Since the model is intended to generate predictions for magnetic flux densities between $B_{c1}$ and $B_{c2}$, i.e., in the mixed state, the channel resistance at or near $B_{c1}$ is assumed to be $R_{crit}$. Therefore, the boundaries of operation for the model range from $R_{crit}$ (at the transition between the pure superconducting state and the mixed state) to $R_{norm}$ for the normal state.

Listing 1 is a VERILOG™ code listing, used to simulate a superconductor magnetic field effect transistor with the physical structure shown in FIG. 1A and the equivalent circuit model shown in FIG. 2. Line 8 of Listing 1 defines the three terminals, i.e., the gate, the drain, and the source. Line 10 defines the inductance (in Henrys) of the gate (i.e., the inductance of the solenoid 110). Line 12 defines a reference gate current (equal to 1 mA), line 14 defines a reference channel current (equal to 1 mA) and line 11 and 13 specify a magnetic flux density (calculated by the three-dimensional electromagnetic model) present in the channel when the reference channel current flows in the channel. Line 20 specifies a small resistance in the superconducting state (a small resistance is used instead of zero to avoid numerical problems in the simulation). Line 21 specifies a channel resistance at Bo (the beginning of the mixed state). The model assumes fixed, non-zero temperature, and in part for this reason the channel resistance $R_{crit}$ defined on line 21 is not specified to be zero. Lines 27-47 define differential equations that may be solved to predict the behavior of the superconductor magnetic field effect transistor. In line 28, the symbol "ddt" is the derivative with respect to time. On lines 33-44, the value of $R_{\_channel}$ is calculated as follows. Once $R_{ff}$ is calculated, the value is compared with $R_{crit}$ and $R_{norm}$. If $R_{ff}$ is lower than $R_{crit}$, then the resistance of the superconducting state, $R_{\_sup}$ is assigned (on line 35) to $R_{\_channel}$. If $R_{ff}$ is between $R_{crit}$ and $R_{norm}$, the calculated Rif is assigned (on line 39) to R channel. If the calculated $R_{ff}$ is greater than $R_{norm}$, the channel becomes the normal state (per line 45).

Figure 3A:
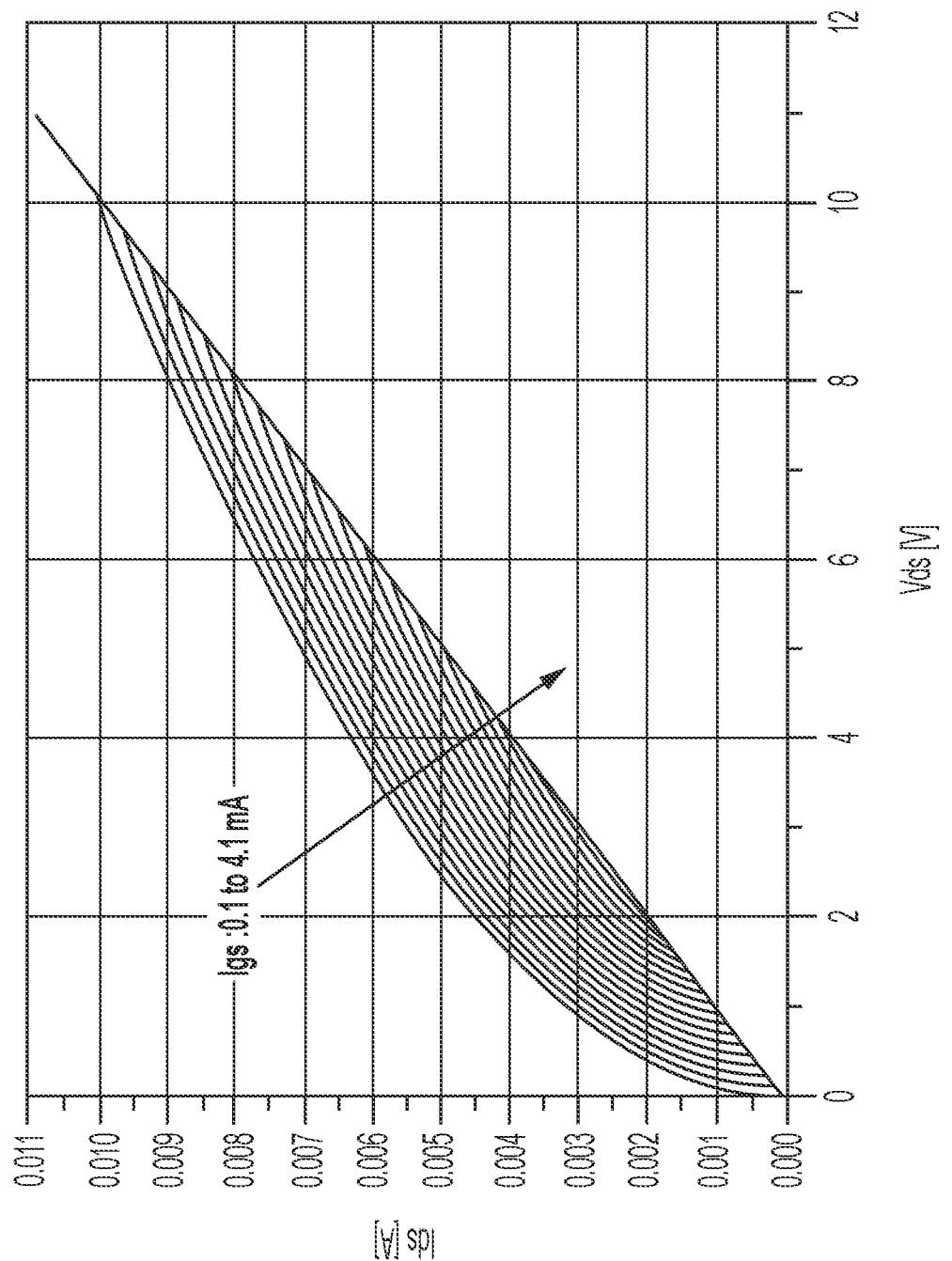
FIG. 3A is a graph of simulated characteristics of a superconductor magnetic field effect transistor, according to an embodiment of the present disclosure.
Figure 3B:
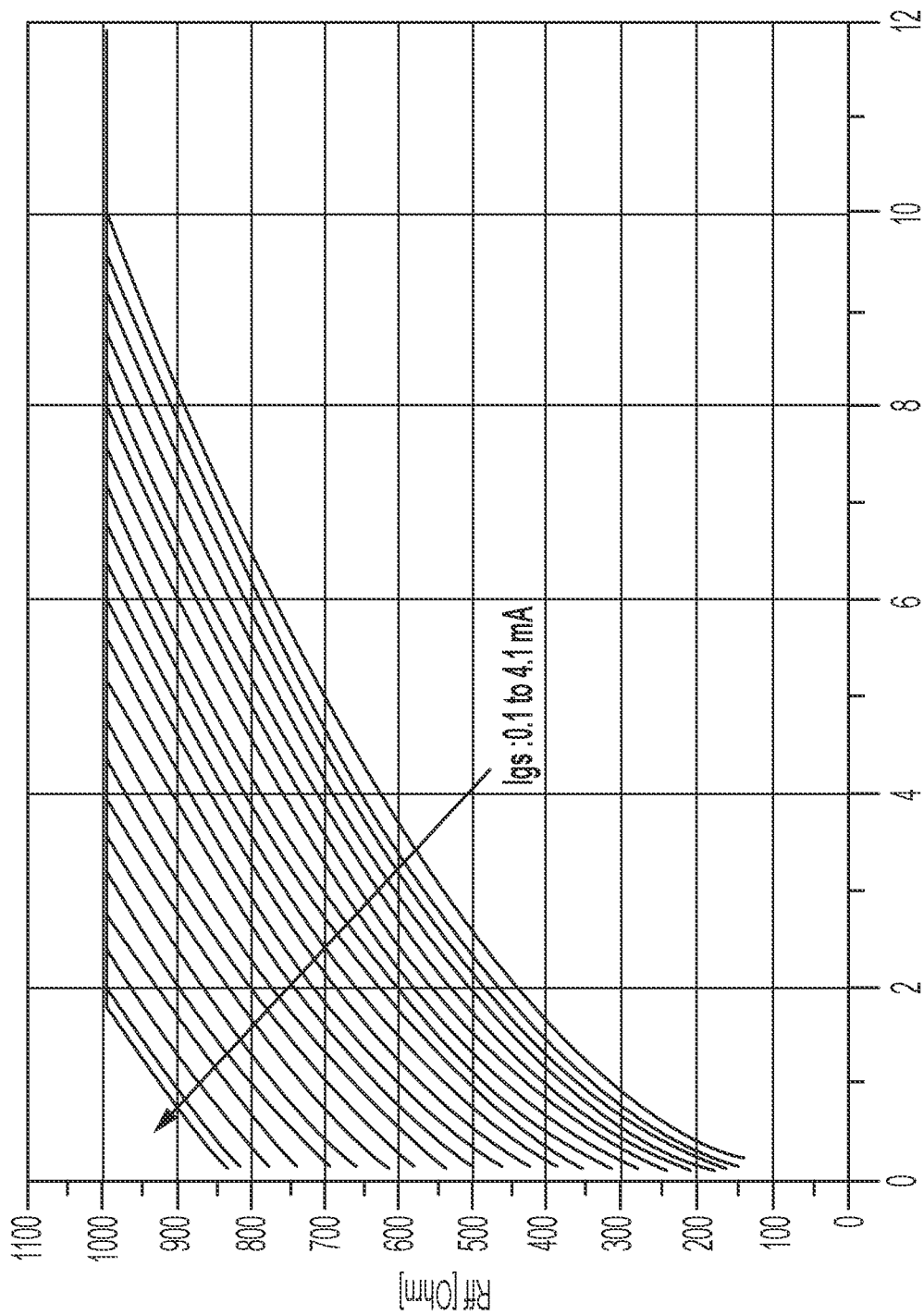
FIG. 3B is a graph of simulated characteristics of a superconductor magnetic field effect transistor, according to an embodiment of the present disclosure.
Figure 3C:
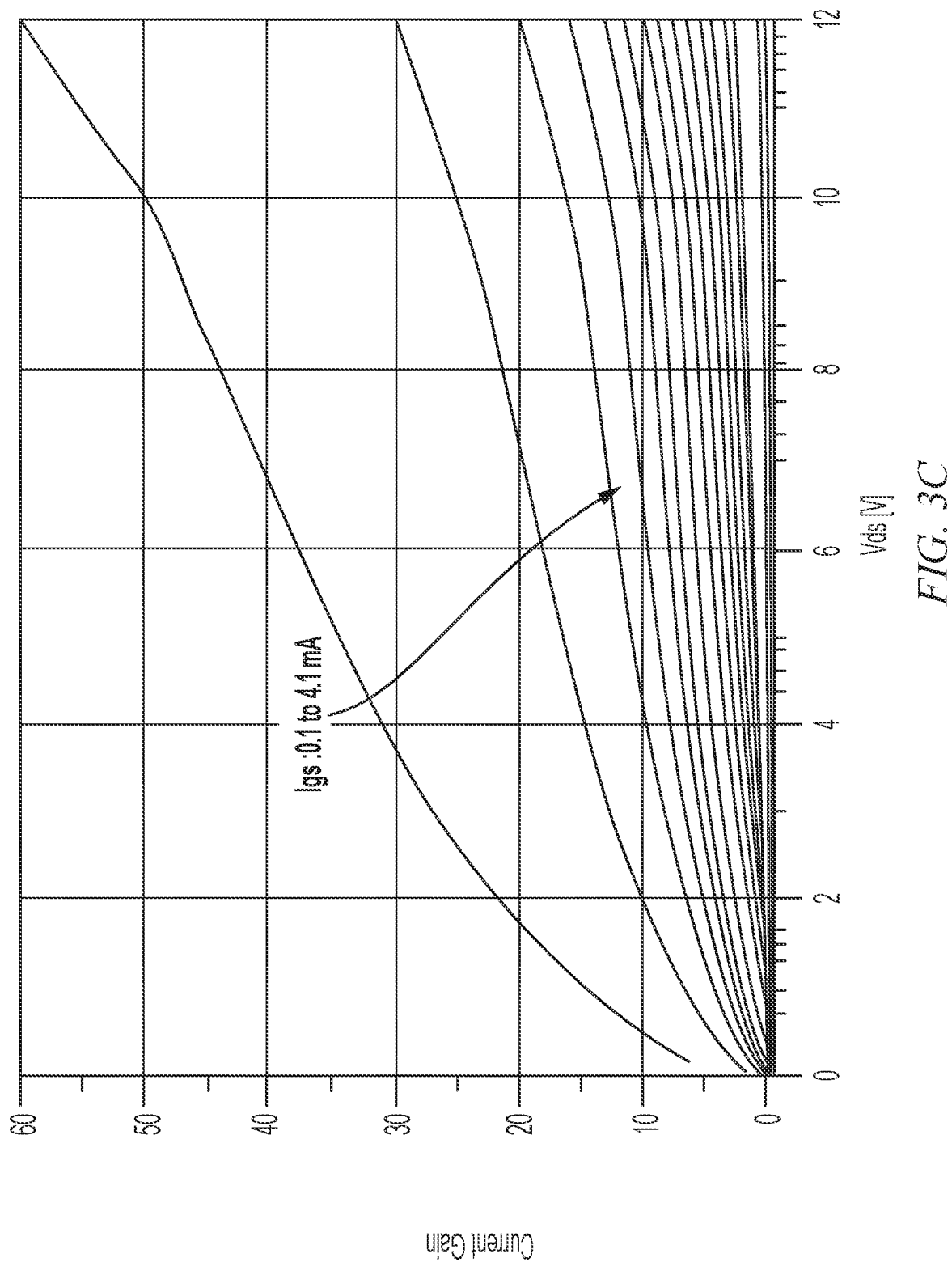
FIG. 3C is a graph of simulated characteristics of a superconductor magnetic field effect transistor, according to an embodiment of the present disclosure.
Figure 3D:
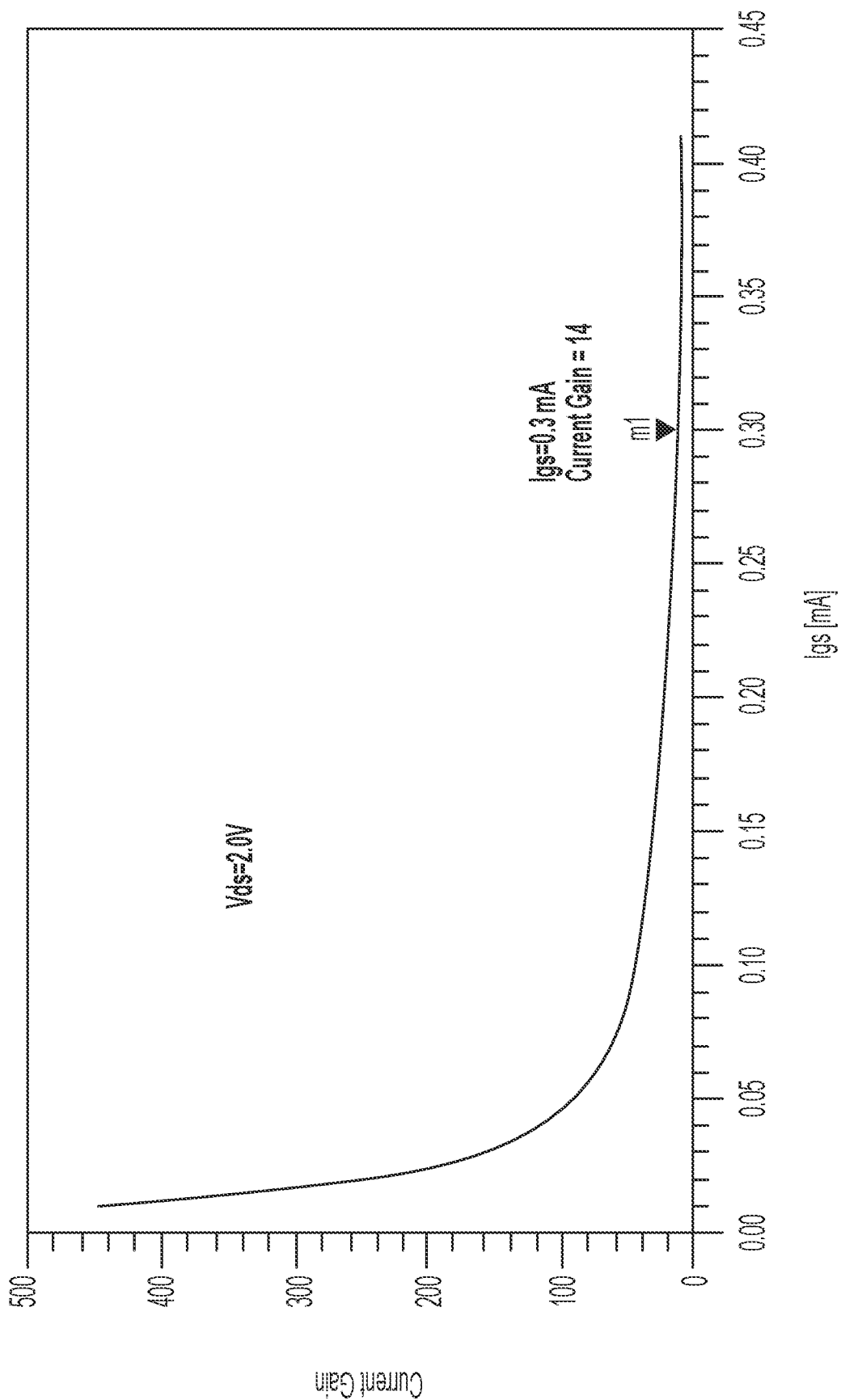
FIG. 3D is a graph of simulated characteristics of a superconductor magnetic field effect transistor, according to an embodiment of the present disclosure.

FIGS. 3A to 3D shows simulation results, obtained using the code of Listing 1 and parameter values identified above. FIG. 3A is a graph of Ids as a function of Vds and as a function of Igs, FIG. 3B is a graph of Rff as a function of Vds and as a function of Igs, FIG. 3C is a graph of current gain as a function of Vds and as a function of Igs, and FIG. 3D is a graph of current gain as a function of Igs, for Vds=2.0 V.

As used herein, a "rectangle" is a parallelogram having right angles at all of its vertices, and the term "rectangle" does not exclude a rectangle in which the lengths of all four sides are the same (i.e., a square). As such, a "square" is a special case of a rectangle. Similarly, "rectangular" includes the adjective "square" as a special case.

As used herein, the word "or" is inclusive, so that, for example, "A or B" means any one of (i) A, (ii) B, and (iii) A and B. As used herein, the term "array" refers to an ordered set of numbers regardless of how stored (e.g., whether stored in consecutive memory locations, or in a linked list).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. When a quantity is described as being "within X % of" a value, the quantity is between $1-(X/100)$ and $1+(X/100)$ times the value.

Although exemplary embodiments of a superconductor magnetic field effect transistor have been specifically described and illustrated herein, many modifications and variations will be apparent to those skilled in the art. Accordingly, it is to be understood that a superconductor magnetic field effect transistor constructed according to principles of this disclosure may be embodied other than as specifically described herein. The invention is also defined in the following claims, and equivalents thereof.

| Listing 1 |
| --- |

```
1     //Superconductor MFET model//
2
3     'include "disciplines.vams"
4     'include "constants.vams"
5
6     module SMFET_core (g, d, s);
7
8        inout g, d, s;
9        electrical g, d, s;
10       parameter real Ind_gate = 200e-12 from [10e-12:500e-
          12];//[H]
11       parameter real Bg0=2e-3; //[T] gate B-field @Ig0
12       parameter real Ig0=1e-3; //[A] gate reference current,
          Ig
13       parameter real Bds0=6.5e-4; //[T] channel B-field@Ids0
14       parameter real Ids0=1e-3; //[A] channel reference
          current, Ids0
15       parameter real Rho_norm = 500e-6; //[Ohm*Cm] normal
          resistivity
16       parameter real W_ch = 0.5e-6; //[m] channel width
17       parameter real L_ch = 10e-6; //[m] channel length
18       parameter real W_t = 100e-9; //[m] channel thickness
19       real R_norm = Rho_norm*(L_ch*1e2)/(W_ch*W_t*1e4);
20       real R_sup =1e-6; // Assumed Superconductorchannel
          Resistance below Bc1
21       real R_crit=10; // Assumed channel resistance @ Bc1
22       real Icrit=20e-3*(W_ch/1e-6); //critical current
23       real Bgate_scale=1e5; //Rff_gate scaling factor
24       real Bds_scale=1.52e5; //Rff_channel scaling factor
25       real R_ff, R_channel, Rff_gate, Rff_ds;
26
27       analog begin
28          V(g, s) <+ Ind_gate*ddt(I(g, s));
29          Rff_gate=(Bgate_scale*Bg0*I(g, s)/Ig0); //Rff by
            gate B-field, 2000hm @ Ig=1mA
30          Rff_ds=(Bds_scale*Bds0*I(d, s)/Ids0); //Rff by
            channel B-field, 1kOhm @Ids=10mA
31          R_ff=(Rff_gate+Rff_ds); //Flux Resistance
32
33          if (R_ff < R_crit)
34             begin
35                R_channel=R_sup;
36             end
37          else if ((R_ff>=R_crit) && (R_ff < R_norm))
38             begin
39                R_channel=R_ff;
40             end
41          else
42             begin
43                R_channel=R_norm;
44             end
45          V(d, s) <+ R_channel*I(d, s);
46
47       end
48     endmodule
```

What is claimed is:

1. A device, comprising:
   a sheet of a superconducting material; and
   a solenoid,
   the sheet being substantially flat, the solenoid comprising a plurality of turns, each of the turns being substantially parallel to the sheet, the superconducting material being a type-II superconducting material, wherein:

the sheet is substantially rectangular;

the sheet has two long edges and two short edges, each of the short edges being at least 10% shorter than each of the long edges; and a respective current-carrying electrode is connected to each of two opposite edges of the sheet.

2. The device of claim 1, wherein a respective current-carrying electrode is connected to each of the short edges.

3. The device of claim 2, wherein each turn of the solenoid is rectangular, octagonal, or circular and has substantially the same dimensions as the sheet.

4. The device of claim 3, wherein the solenoid comprises more than 1 turns on a first side of the sheet.

5. The device of claim 4, wherein the solenoid further comprises the same number of turns on a second side of the sheet, the second side of the sheet being opposite the first side of the sheet.

6. The device of claim 5, wherein the solenoid is configured to produce a magnetic field having a magnetic field strength uniform to within 10% within the sheet.

7. The device of claim 5, further comprising a ferromagnetic element, the ferromagnetic element being configured to increase the magnetic field strength at a point in the sheet.

8. The device of claim 7, wherein the ferromagnetic element comprises an E-core.

9. The device of claim 1, wherein the device exhibits a current gain of at least 5, at a voltage drop across the sheet of 2 V and a solenoid current of 100 microamperes, the current gain being the ratio of current flowing through the sheet to current flowing in the solenoid.

10. The device of claim 1, wherein the solenoid comprises a superconductor having a critical temperature greater than that of the sheet.

11. The device of claim 1, wherein the solenoid comprises a superconductor having a first critical magnetic field strength greater than that of the sheet.

12. The device of claim 1, wherein the solenoid comprises a superconductor having a second critical magnetic field strength greater than that of the sheet.

* * * * *